United States Patent [19]

Sato et al.

[11] Patent Number: 4,767,931

[45] Date of Patent: Aug. 30, 1988

[54] ION BEAM APPARATUS

[75] Inventors: Tadashi Sato, Mito; Tomoe Kurosawa; Shigetaka Fujiwara, both of Hitachi; Masaru Higaki, Katsuta, all of Japan

[73] Assignee: Hitachi, Ltd., Tokyo, Japan

[21] Appl. No.: 942,711

[22] Filed: Dec. 17, 1986

[51] Int. Cl.[4] .............................................. H01J 7/24
[52] U.S. Cl. ............................ 250/423 R; 250/492.2; 315/111.81; 315/111.21; 315/111.71
[58] Field of Search ............... 250/423 R, 423 F, 424, 250/427, 429, 492.2, 492.21; 376/129, 130; 315/111.81, 111.21, 111.31, 111.41, 111.51, 111.71

[56] References Cited

U.S. PATENT DOCUMENTS

| 4,383,177 | 5/1983 | Keller et al. ................... 250/423 R |
| 4,661,710 | 4/1987 | Verney et al. .................. 250/423 R |

FOREIGN PATENT DOCUMENTS

| 0063799 | 5/1981 | Japan . |
| 0054797 | 5/1981 | Japan . |
| 0132015 | 1/1985 | Japan .......................... 250/423 R |
| 0130039 | 7/1985 | Japan .......................... 250/423 R |
| 0195855 | 10/1985 | Japan .......................... 250/423 R |
| 0138432 | 6/1986 | Japan . |

OTHER PUBLICATIONS

Kaufman et al., "Technological Applications of Broad-Beam Ion Sources Used in Sputtering, Pt. 1, Ion Source Technology," J. Vac. Sci. Tech., 21(3) Sep.-/Oct. 82.

Kaufman, "Broad-Beam Ion Sources: Present Status and Future Directions," J. Vac. Sci. Tech., 4(3) May/-Jun. 1986.

Primary Examiner—Bruce C. Anderson
Assistant Examiner—Paul A. Guss
Attorney, Agent, or Firm—Antonelli, Terry & Wands

[57] ABSTRACT

A thin film manufacturing and processing apparatus by using an ion beam comprises a plasma producing vessel for producing therein a plasma by ionizing a neutral gas, an electrode assembly for extracting ions in the form of an ion beam from the plasma, a vacuum container accomodating therein a target to be worked through irradiation of the ion beam, and permanent magnets disposed on the outer periphery of the plasma generating vessel which is formed of a nonmagnetic material and serves as an anode electrode. An ion beam of high uniformity and a large diameter can be obtained to allow manufacture and processing of large scale magnetic thin films and semiconductors with high precision.

9 Claims, 8 Drawing Sheets

ION BEAM APPARATUS

BACKGROUND OF THE INVENTION

The present invention relates to an apparatus for processing a target and/or manufacturing a thin film through irradiation of the target with an ion beam. More particularly, the invention concerns an ion beam apparatus suited advantageously for manufacturing and/or processing large scale thin films and semiconductors.

Figure 1:
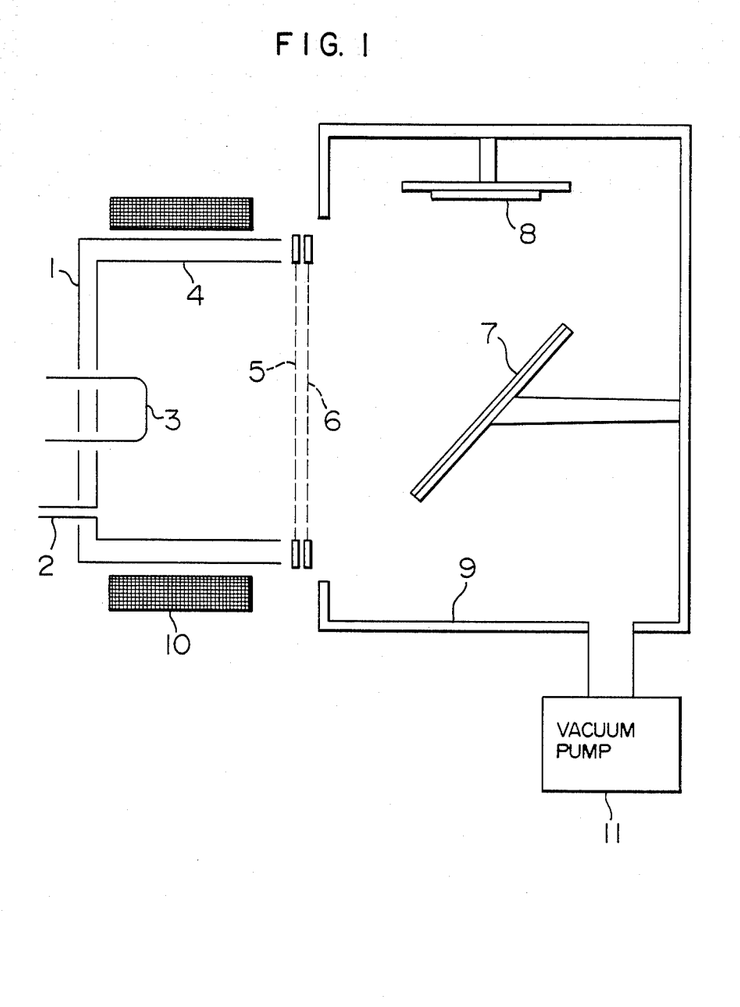
FIG. 1 is a schematic view showing a structure of a hitherto known apparatus for manufacturing and processing a thin film by means of an ion beam.

As an apparatus for processing a surface of a target and/or forming a thin film on a substrate located in opposition to the target by physically sputtering or chemically etching the target through irradiation with an ion beam having energy on the order of 200 to 5000 eV, there has heretofore been known a structure schematically shown in FIG. 1 of the accompanying drawings. More specifically, referring to FIG. 1, a neutral gas or an active gas is introduced into a cylindrical plasma producing vessel 1 through a gas inlet port 2, wherein arc discharge is caused to take place between a filament 3 and an anode electrode 4 to produce plasma from which an ion beam is extracted under the influence of the electric field generated by ion extracting electrodes 5 and 6 to sputter or etch a target 7 for the processing thereof or formation of a thin film on a substrate 8 disposed in opposition to the target 7. All the components mentioned above are accommodated within a vacuum vessel 9 adapted to be evacuated by a vacuum pump 11. A solenoid coil 10 serves to enhance the efficiency at which the plasma is generated and plays an important role in allowing the apparatus to operate with a small amount of gas.

As the ion beam of an increased diameter is required to be employed in accompaniment to the tendency of thin films being formed on a larger scale, a demand arises for the use of the plasma producing vessel of a larger diameter which in turn involves the use of the solenoid coil 10 of an increased size, giving rise to a problem that leakage of the magnetic field generated by the solenoid coil 10 toward the target 7 or the substrate 8 occupies a large proportion. Obviously, such great leakage of the magnetic field makes it difficult to control the magnetic anisotropy and other properties, not to speak of degradation in performance of the apparatus. Further, the ion beam as extracted is bent under the action of the leakage field to degrade the parallelism of the ion beam, being accompanied by deterioration in the working precision.

In order to attain a high precision in the manufacture and processing of the thin film by using an ion beam, it is required that the ion beam has a high uniformity, a small angle of beam divergence and a high parallelism. In the case of the ion beam apparatus shown in FIG. 1, however, a part of plasma located in the vicinity of the inner wall of the plasma producing vessel 1 is cooled through contact with the wall of the vessel 1, bringing about loss of plasma. As the result, distribution of the plasma density becomes such that the plasma density is high at the center of the opening of the plasma producing vessel 1 and becomes low toward the end of the opening. Consequently, the plasma pressure on the surface of the extracting electrode 5 which affects the electric field formed in the apertures of the electrode becomes high at the center region of the extracting electrode and becomes low toward the periphery thereof, resulting in that the electric fields formed in the apertures of the extracting electrodes 5 and 6 become different between the apertures located at the center region and those located at the peripheral portion. Due to such nonuniformity in distribution of the plasma density and the electric field, the uniform ion beam is difficult to be produced. Accordingly, it is impossible to accomplish the high precision processing with the ion beam apparatus shown in FIG. 1.

Figure 2:
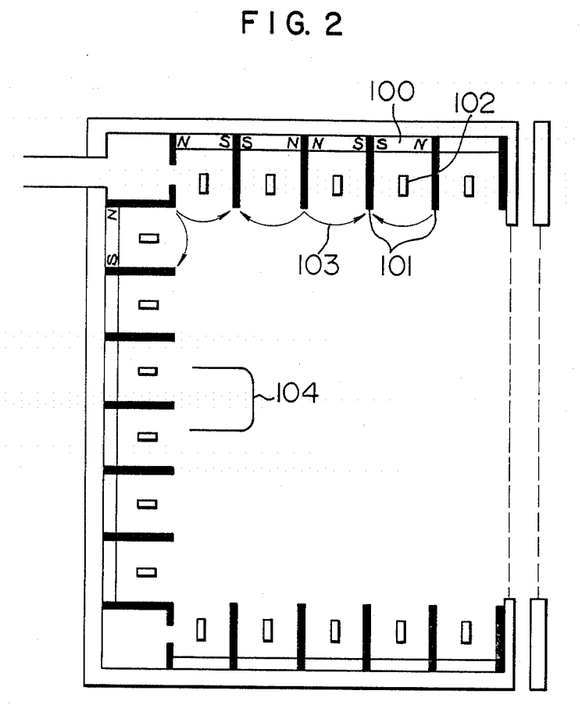
FIG. 2 is a schematic view showing a structure of a hitherto known ion source for sputtering applications.

FIG. 2 shows another ion beam apparatus known heretofore. The similar ion beam apparatus are disclosed in "Technology and Application of Broad-Beam Ion Sources used in Sputtering, Part 1, Ion Source Technology" by H. R. Kaufman et al. J. Vac. Sci. Technol., 21 (3), Sept./Oct. 1982 and "Broad-Beam Ion Sources: Present Status And Future Directions" by H. R. Kaufman, J. Vac. Sci. Technol.A4 (3), May/June 1986. The ion beam apparatus is of such a structure in which a discharge chamber is provided, which is composed of permanent magnets 100, pole pieces 101 extending inwardly of the plasma producing vessel from both ends of one permanent magnet and anode electrodes 102 each provided in a space defined by one magnet and two pole pieces, wherein the magnets 100, pole pieces 101 and the anode electrodes 102 are arrayed along the inner wall of the plasma producing vessel. The ion beam generating apparatus of this type suffers however a shortcoming that maintenance thereof is difficult. More specifically, all the corners and hidden surfaces behind the anode electrodes of the ion beam producing apparatus require cleaning, and for the cleaning, the ion beam apparatus has to be disassembled. However, great difficulty and troublesome procedure will be involved in disassembling this known ion beam producing apparatus.

Another problem of this ion beam producing apparatus is seen in that the confinement of plasma can not be achieved satisfactorily. As is shown in FIG. 2, the anode electrode is disposed at a position retracted from the tip end of the pole shoe. In other words, the anode electrode is positioned outside of the plasma confining region defined by the magnetic flux 103 formed between the tips of the pole pieces. Although electrons emitted from the filament 104 must reach the anode electrodes 102 by traversing the magnetic flux, the electrons are prevented from traversing the magnetic flux when the magnetic field is too strong. Thus, when the magnetic field is intensified with a view to confine adequately the plasma, electrons can not arrive at the anode electrode. Accordingly, the magnetic flux density is necessarily limited to less than several tens gausses which is insufficient for confining the plasma. For these reasons, the ion beam producing apparatus is incapable of accomplishing satisfactorily the plasma confinement.

Japanese Patent Application Laid-Open No. 54797/1981 (JP-A-56-54797) discloses an ion source apparatus in which permanent magnets are disposed around the plasma producing vessel. However, this ion source apparatus is not designed for use in fabrication and processing of thin films as in the case of the present invention but destined for use as a neutron injection heater apparatus for an experimental nuclear fusion equipment.

Japanese Patent Application Laid-Open No. 63799/1981 (JP-A-56-63799) discloses an ion source apparatus in which permanent magnets are disposed within a plasma generating vessel. However, this apparatus is also intended to be employed in a plasma heating neutral particle injection apparatus and can not be used for fabrication and processing of thin films as with the case of the apparatus disclosed in JP-A-56-54797 mentioned above.

Reference may be made to JP-A-61-138432 (corresponding to U.S. patent application Ser. No. 806,341 filed on Dec. 9, 1985) laid-open Jun. 25, 1986. Ion sources have been also proposed in U.S. patent application Ser. No. 911,790 filed on Sept. 26, 1986 and U.S. patent application Ser. No. 914,196 filed on Oct. 1, 1986.

SUMMARY OF THE INVENTION

An object of the present invention is to provide a thin film manufacturing and/or processing apparatus in which an ion beam is made use of and in which magnetic field leakage toward a target and/or a substrate can be suppressed to a minimum.

Another object of the present invention is to provide a thin film manufacturing and/or processing apparatus which is capable of producing an ion beam of improved uniformity and large diameter.

Still another object of the invention is to provide an apparatus for manufacturing and/or processing thin films by using an ion beam and which apparatus can assure satisfactory confinement of plasma.

A further object of the present invention is to provide an apparatus for manufacturing and/or processing thin films by using an ion beam and which apparatus allows facilitated maintenance.

In view of the above objects, there is provided according to an aspect of the present invention an ion beam apparatus which comprises a plasma ion producing vessel for producing plasma by ionizing a neutral gas, electrodes for extracting ions from the plasma in the form of an ion beam, a target to be irradiated with the ion beam, and a vacuum vessel for accommodating the target, wherein the plasma producing vessel is made of a nonmagnetic material and used as an anode and has permanent magnets disposed around the outer periphery in such a manner in which polarities of magnetic poles are alternately changed.

In order to produce the plasma with an enhanced efficiency and extract the ion beam of high uniformity and large diameter from the plasma confined within a predetermined space, it is required that the plasma as produced can be confined without being brought into contact with the wall of the plasma producing vessel by generating such a magnetic field intensity distribution that the magnetic field intensity is sufficiently low in the vicinity of the extracting electrode and sufficiently strong in the vicinity of the inner wall surface of the plasma producing vessel.

The results of experiments conducted by the inventors of the present application have shown that when the magnetic field generated by permanent magnets disposed with N and S poles being alternately changed is utilized for confining the magnetic field, the intensity of the magnetic field is steeply decreased to a level substantially equal to the terrestrial magnetism at a location distanced from the permanent magnet row by several centimeters notwithstanding of the fact that the magnetic field exhibits high intensity in the vicinity of the permanent magnets, whereby the parallelism of the ion beam can be significantly improved because the intensity of the magnetic field affecting the movement of ion beam is decreased to the order of magnitude of the terrestrial magnetism. Thus, the ion beam apparatus is advantageously suited for the manufacturing and/or minute processing of magnetic thin films and semiconductor devices.

Further, due to such arrangement that the plasma producing vessel is made of a nonmagnetic material and used as the anode and that the permanent magnets are disposed around the outer periphery of the plasma producing vessel, the magnetic field of sufficient intensity for confining the plasma can be produced without providing an obstacle for the electrons emitted from a filament serving as the cathode to reach the plasma producing vessel serving as the anode.

DESCRIPTION OF THE PREFERRED EMBODIMENTS

The present invention was described in "Bucket-type Ion Source For Ion Milling", journal of Vacuum Science and Technology A Second Series, Volume 4, Number 3, Part 1, May/June 1986.

Figure 4:
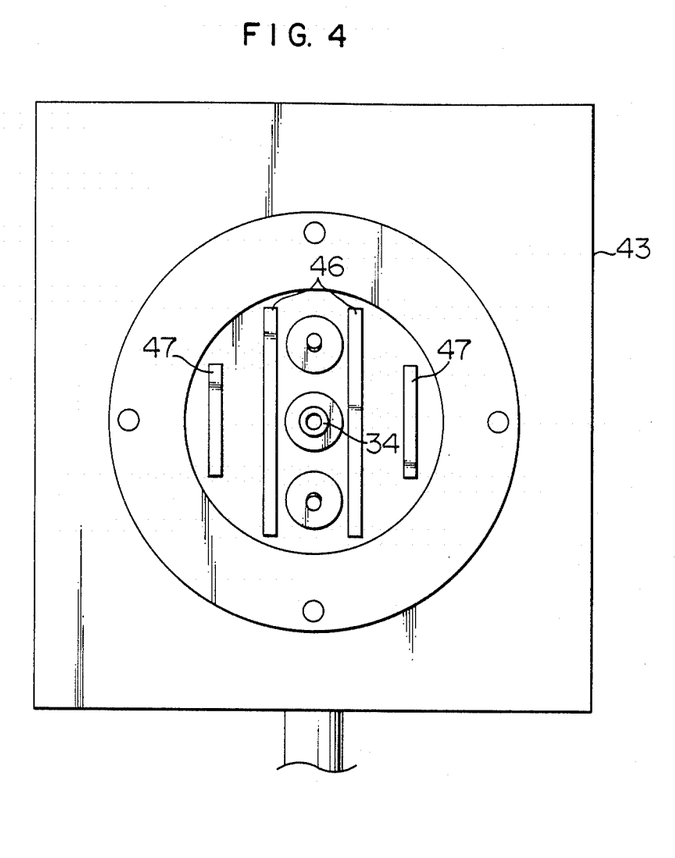
FIG. 4. is a side view of the apparatus shown in FIG. 3 as viewed from the lefthand side thereof.
Figure 5:
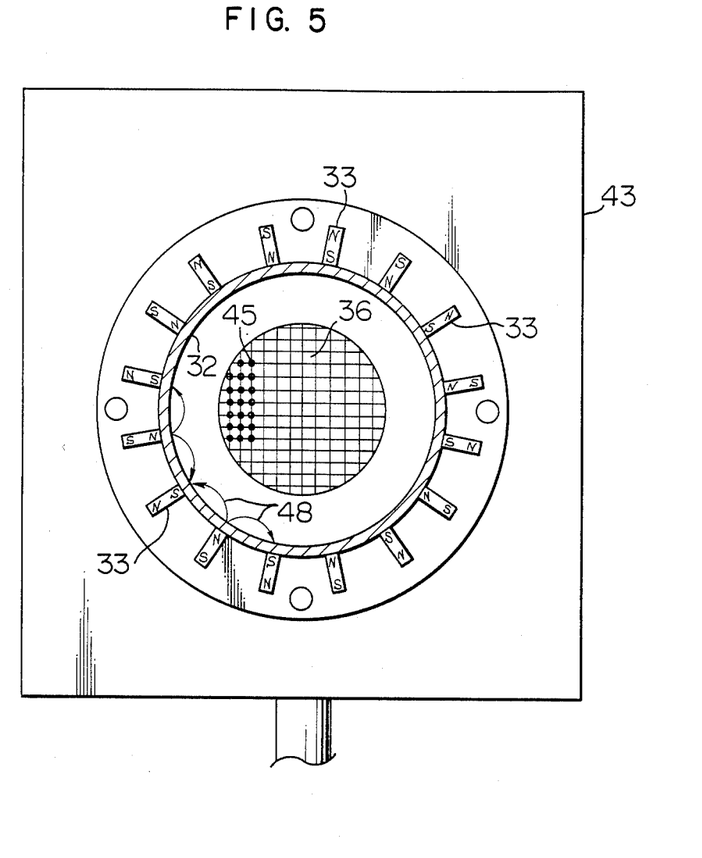
FIG. 5 is a sectional view of the apparatus taken along a line V—V in FIG. 3.

Now, the invention will be described in conjunction with exemplary embodiments with reference to FIGS. 3 to 5.

Figure 3:
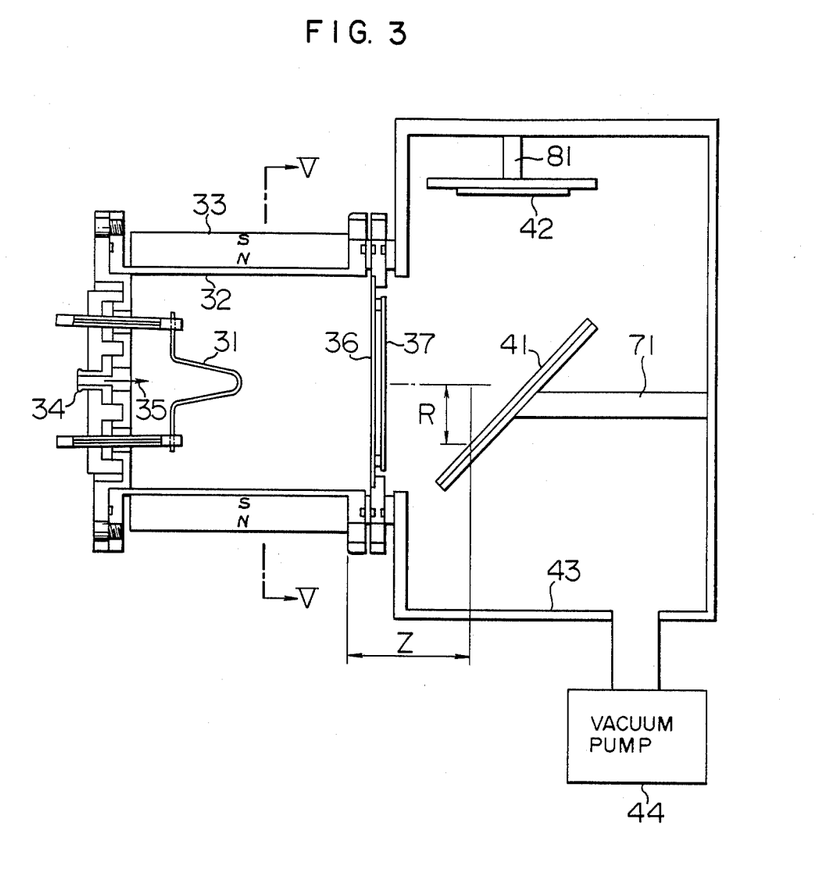
FIG. 3 is a view showing an apparatus for manufacturing and processing thin films by making use of an ion beam according to an exemplary embodiment of the invention.

Referring to FIG. 3, a cathode electrode 31 is made of a tungsten filament for emitting electrons. A plasma producing vessel 32 of a cylindrical configuration defining a plasma producing chamber therein is formed of a nonmagnetic material and serves also as an anode electrode for causing arc discharge to be produced between the cathode 31 and the plasma vessel 32. Disposed on and around the outer peripheral surface of the plasma producing vessel 32 is a cylindrical array of permanent magnets 33 in a radial pattern with the magnetic polarities of the magnetic poles being alternated along the circumferential direction of the cylindrical vessel, as will be seen in FIG. 5. The plasma producing vessel 32 may be made of stainless steel and dimensioned, for example, such that the inner diameter is 150 mm, the outer diameter is 156 mm and the depth is 150 mm. The number of the permanent magnets 33 may be sixteen, each of which may be 8 mm in width, 25 mm in height and 150 mm in length and magnetized heightwise. Further, two pairs of permanent magnets 46 and 47 having lengths of 120 mm and 40 mm, respectively, are disposed on the outer end wall of the cylindrical vessel 32 on the side where the filament 31 is fixedly supported, as will be seen in FIG. 4. Each of the permanent magnets 46 and 47 has a width and a height equal to each other. In the case of the illustrated embodiment, each of the permanent magnets was made of a samarium cobalt material having a residual magnetism of 8500 gausses. Correspondingly, the plasma producing vessel 32 is made of a nonmagnetic material such as stainless steel or the like so that magnetic lines of force are generated by the permanent magnets 33 inside of the plasma producing vessel 32. By applying a DC voltage across the cathode 31 and the plasma producing vessel 32 also serving as the anode, arc discharge is produced at a low pressure so as to generate plasma. For extracting ions resulting from the plasma in the form of an ion beam, a beam extracting electrode assembly is provided which is composed of a plasma electrode 36 and an accelerating electrode 37 each having a large number of apertures 45 formed therein (refer to FIG. 5). A target 41 and a substrate 42 are fixedly disposed within a vacuum vessel 43 by means of supporting mechanisms 71 and 72, respectively. The vacuum vessel 43 is adapted to be evacuated through a vacuum pump 44. The supporting mechanism 71 may be implemented in such a structure that the target 41 is rotatably supported so as to be irradiated with the ion beam to thereby realize a uniform processing of the target 41. When a thin film is to be formed on the substrate 42, the substrate 42 is disposed on the supporting means 81, while a plate formed, for example, of a permalloy is disposed on the supporting means 71 for performing sputtering by irradiating the permalloy plate with the ion beam.

In an experiment, an argon gas was introduced as a neutral gas through an inlet 34, and efficiency of producing plasma of argon ions in the absence of the permanent magnets 33 at a requisite arc power level was compared with the plasma producing efficiency attained in the presence of the permanent magnets 33. It has been found that the provision of the permanent magnets 33 is effective for reducing the arc power by a factor of ¼ to 1/5 or less. In other words, generation of plasma for argon gas can be realized with higher efficiency by using the permanent magnets 33 with interposition of the plasma producing vessel 32 of a nonmagnetic material.

Figure 6:
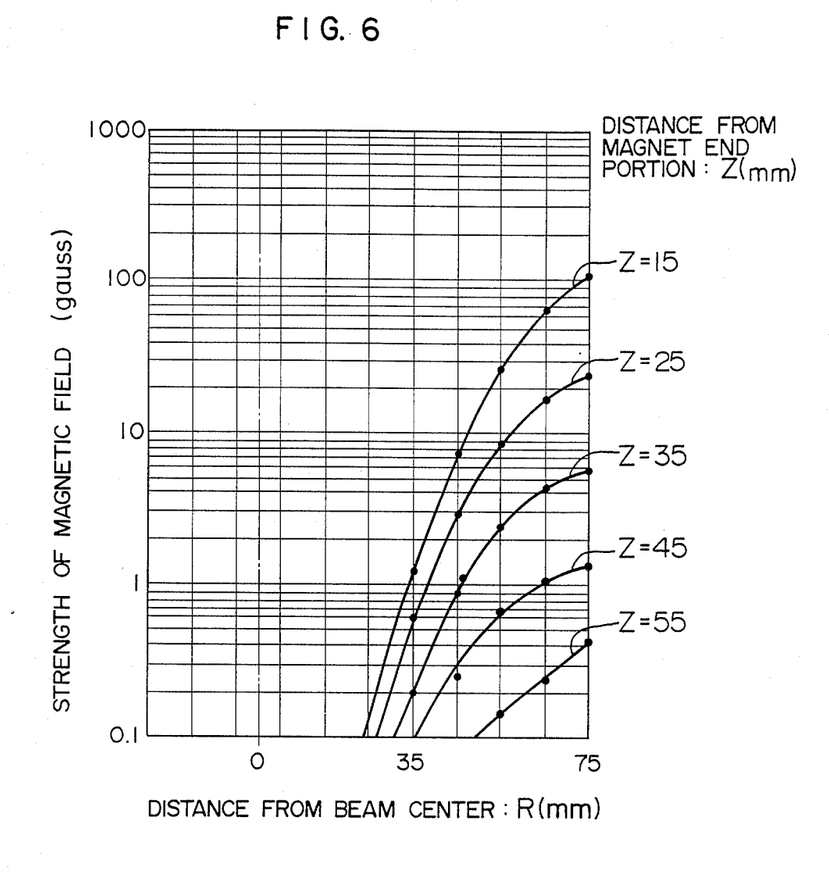
FIG. 6 is a view for graphically illustrating magnetic field distribution characteristics of the apparatus according to the present invention.

FIG. 6 is a view for graphically illustrating the magnetic field distributions produced by the permanent magnets 33. It will be seen from the figure that in a range where the distance Z (see FIG. 3) between the target 41 or substrate 42 and the end of the adjacent permanent magnets 33 is greater than 60 mm, the field intensity is smaller than 1 gauss and on the same order as the magnitude of the terrestrial magnetism. Further, it can be seen that in a range where the distance R from the center of ion beam is about 33 mm, the magnetic field intensity is of substantially same order as the magnitude of the terrestrial magnetism. In this manner, the intensity of magnetic field is considerably reduced over a wide range at the location of the extracting electrodes 36 and 37, whereby a uniform ion beam of a large diameter can be obtained. In this connection, it will be understood that a strong magnetic field 48 for confining the plasma is produced along the wall surface of the plasma producing vessel 32 to effectively confine the plasma, preventing the plasma from directly contacting with the vessel wall to assure the uniform plasma density distribution, which also contributes to formation of the uniform ion beam of a large diameter. The strong magnetic field 48 is not only effective for confining the plasma but also exerts influence under which the electrons emitted from the filament 31 and lost energy after repeated collisions with molecules such as argon molecules are moved along the magnetic field 48 to reach the inner wall surface of the plasma producing vessel 32 which serves for the function of the anode elctrode.

As will be seen in FIG. 3, the plasma producing vessel 32 accommodates therein only the filament 31. With this structure, the apparatus according to the illustrated embodiment can be easily disassembled and cleaned, thus assuring an improved maintenance capability.

Figure 7:
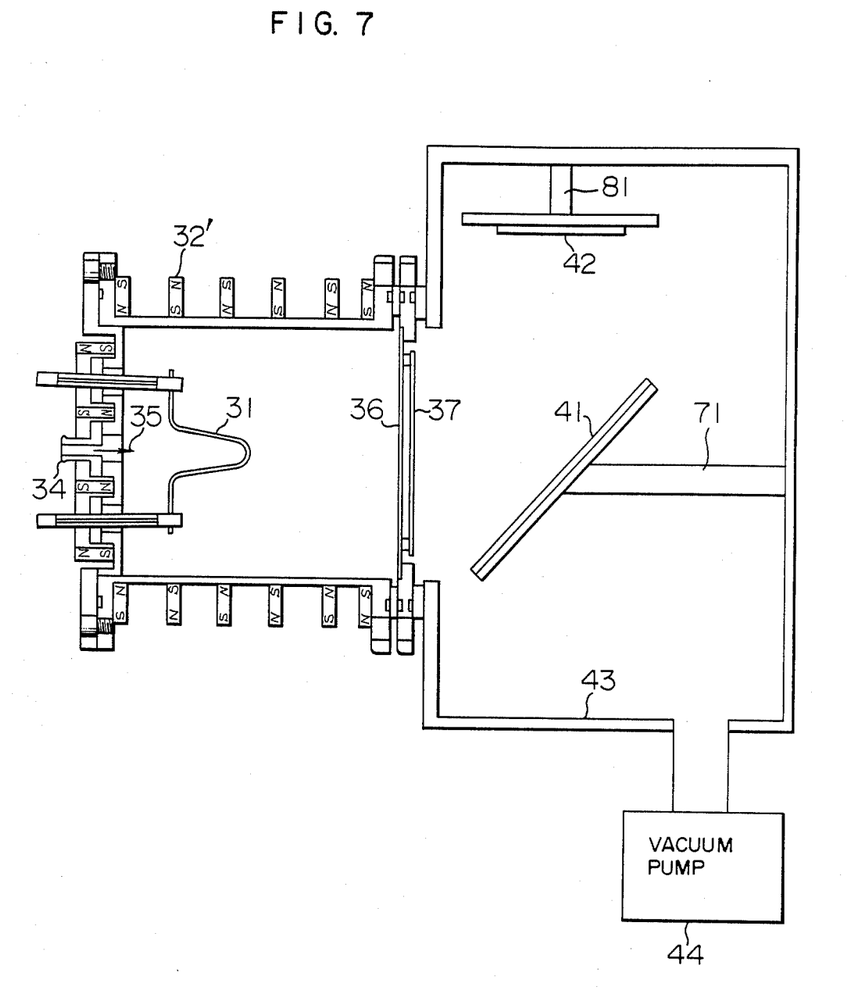
FIGS. 7 and 8 are views showing different embodiments of the ion beam apparatus according to the present invention.

FIG. 7 is a view showing an ion source apparatus according to another embodiment of the present invention. This apparatus differs from the one shown in FIG. 3 in that permanent magnets 32' are disposed on and around the outer surface of the plasma producing vessel 32 with the magnetic polarities being alternately changed along the axial direction of the cylindrical plasma generating vessel 32. In respect to the other structural arrangement, the apparatus shown in FIG. 7 is substantially same as the one shown in FIG. 3. Accordingly, further description will be unnecessary, being understood that similar advantageous effects as those of the apparatus shown in FIG. 3 can be obtained.

Figure 8:
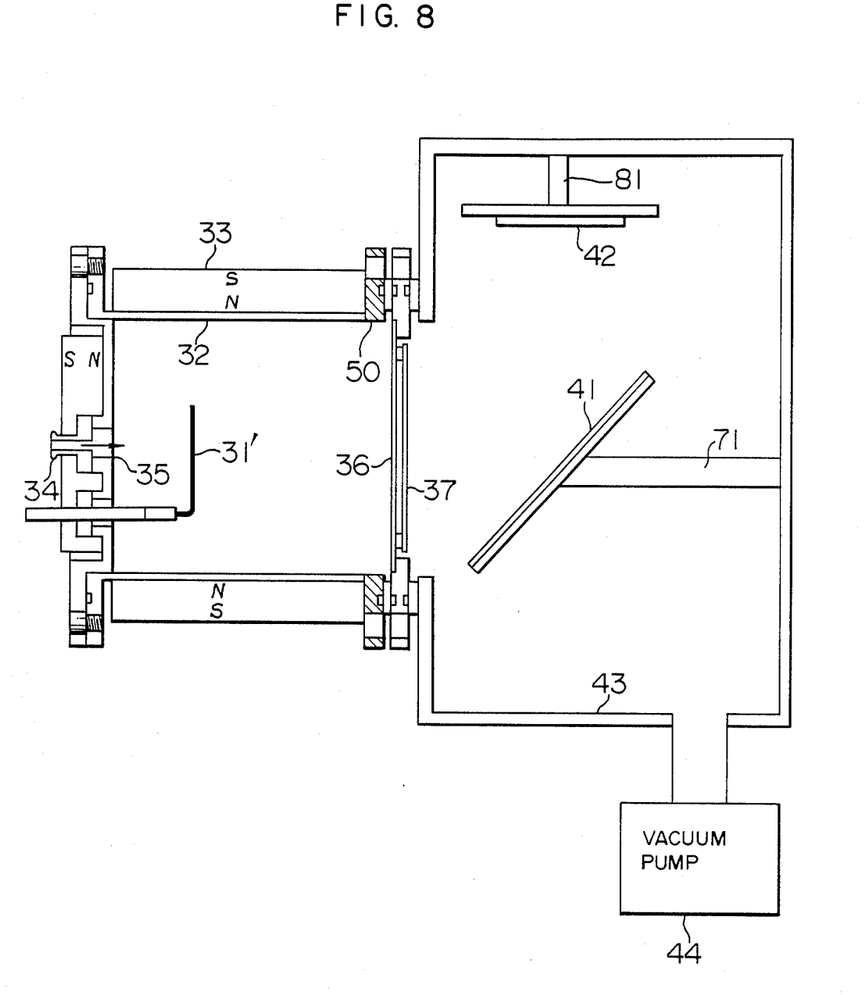

FIG. 8 shows still another embodiment of the ion beam apparatus which differs from the embodiments shown in FIGS. 3 and 7 in that a magnetic shunt 50 is additionally provided at the ends of the permanent magnets 33 and that the cathode 31' is implemented in the form of hairpin-like tungsten filament. Except for the provision of the magnetic shunt 50 and the hairpin-like configuration of the cathode, the structure is same as that of the embodiments shown in FIGS. 3 and 7. Accordingly, further description is omitted. It goes without saying that the hairpin-like cathode 31' can be equally employed in the embodiments shown in FIGS. 3 and 7.

As will now be appreciated, according to the teachings of the present invention, the leakage of the magnetic field is significantly reduced down to the substantially same level as the terrestrial magnetism, whereby parallelism of the ion beam can be improved significantly when compared with the hitherto known apparatus, whereby high precision and minute processing or working can be performed on magnetic thin films and semiconductors, while ensuring impartment of accurate magnetic anisotropy to the magnetic thin film. Further, since the ion beam of high uniformity and large diameter can be produced, there is made available an ion beam apparatus which is advantageously suited for processing and/or manufacturing large scale magnetic thin films and semiconductors with high accuracy. Besides, the apparatus according to the invention can enjoy improved maintenance capability because of the facilitated disassembly.

Further, it is self-explanatory that semiconductor devices can be manufactured with the apparatus according to the invention by employing a semiconductor substrate applied with photoresist in a predetermined pattern.

We claim:

1. An ion beam apparatus for use in processing a target or manufacturing a thin film through irradiation of a target with an ion beam of about 200 to 5000 eV, comprising:
 a plasma producing vessel accommodating cathode electrode means for generating plasma by ionizing a neutral gas;
 ion extracting electrode means for extracting ions from said plasma in the form of an ion beam;

a vacuum vessel including target holding means for holding a target to be irradiated with said ion beam; and permanent magnets provided on the outer surface of said plasma producing vessel with magnetic poles of different polarities being alternately disposed;

wherein said plasma producing vessel is made of a nonmagnetic material and comprises an anode electrode.

2. An ion beam apparatus according to claim 1, wherein said plasma producing vessel is a cylinder having an axis extending in parallel with the direction in which said ion beam travels, said permanent magnets being disposed on the outer surface of said cylindrical plasma producing vessel such that polarities of magnetic poles of said permanent magnets are alternately changed along the circumferential direction of said vessel.

3. An ion beam apparatus according to claim 2, further including a magnetic shunt disposed at ends of said permanent magnets in opposition to said target.

4. An ion beam apparatus according to claim 2, wherein said vacuum vessel includes substrate supporting means for supporting a substrate in opposition to said target.

5. An ion beam apparatus according to claim 1, wherein said plasma generating vessel is a cylinder having an axis extending in parallel with the direction in which said ion beam travels, said permanent magnets being so disposed on the outer surface of said cylindrical plasma producing vessel that the magnetic polarities of the magnetic poles of said permanent magnets are alternately changed along the axial direction of said vessel.

6. An ion beam apparatus according to claim 5, wherein said vacuum vessel further includes substrate supporting means for supporting a substrate in opposition to said target.

7. A ion beam apparatus according to claim 1, wherein said ion extracting electrode means includes at least one electrode having a plurality of apertures therein for extracting ions resulting from the plasma in the form of an ion beam of large diameter.

8. An ion beam apparatus according to claim 1, wherein said plasma producing vessel, and said permanent magnets cooperate so that the intensity of a magnetic field in the region of the extracting electrode means is substantially less than the intensity of a magnetic field in the region of an inner wall surface of said plasma producing vessel.

9. An ion beam apparatus according to claim 8, wherein the intensity of the magnetic field in the region of the extracting electrode means is substantially equal to a level of terrestrial magnetism.

* * * * *